(12) United States Patent
Lindenberg et al.

(10) Patent No.: US 11,402,426 B2
(45) Date of Patent: Aug. 2, 2022

(54) INDUCTIVE TESTING PROBE APPARATUS FOR TESTING SEMICONDUCTOR DIE AND RELATED SYSTEMS AND METHODS

(71) Applicant: Micron Technology, Inc., Boise, ID (US)

(72) Inventors: Tony M. Lindenberg, Boise, ID (US); Kurt J. Bossart, Eagle, ID (US); Jonathan S. Hacker, Meridian, ID (US); Chandra S. Tiwari, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/083,193

(22) Filed: Oct. 28, 2020

(65) Prior Publication Data

US 2021/0041495 A1 Feb. 11, 2021

Related U.S. Application Data

(62) Division of application No. 15/839,559, filed on Dec. 12, 2017, now Pat. No. 10,852,344.

(51) Int. Cl.
*G01R 31/28* (2006.01)
*H01L 21/67* (2006.01)
(Continued)

(52) U.S. Cl.
CPC ..... *G01R 31/2831* (2013.01); *G01R 1/07342* (2013.01); *G01R 31/2863* (2013.01);
(Continued)

(58) Field of Classification Search
CPC ............ G01R 31/2831; G01R 31/2889; G01R 1/07342; G01R 31/2863; G01R 31/2865;
(Continued)

(56) References Cited

U.S. PATENT DOCUMENTS 6,787,375 B2   9/2004   Cheng et al.
6,900,459 B2   5/2005   Farnworth et al.
(Continued)

FOREIGN PATENT DOCUMENTS

CN   101617242 A   7/2012
CN   101499472 A   9/2012
(Continued)

OTHER PUBLICATIONS

Chinese Office Action and Search Report for Application No. 201811488517.4, dated Dec. 28, 2020, 34 pages.
(Continued)

*Primary Examiner* — Farhana A Hoque
(74) *Attorney, Agent, or Firm* — TraskBritt (57) ABSTRACT

A testing probe apparatus for testing die. The testing probe may include a probe interface and a carrier for supporting at least one die comprising 3D interconnect (3DI) structures. The probe interface may be positionable on a first side of the at least one die and include a voltage source and at least one first inductor operably coupled to the voltage source. A voltage sensor and at least one second inductor coupled to the voltage sensor may be disposed on a second opposing side of the at least one die. The voltage source of the probe interface may be configured to inductively cause a voltage within the 3DI structures of the at least one die via the at least one first inductor. The voltage sensor may be configured to sense a voltage within the at least one 3DI structure via the at least one second inductor. Related systems and methods are also disclosed.

20 Claims, 6 Drawing Sheets

(51) Int. Cl.
*G01R 1/073* (2006.01)
*H01L 21/68* (2006.01)

(52) U.S. Cl.
CPC ..... *G01R 31/2865* (2013.01); *G01R 31/2889* (2013.01); *H01L 21/67259* (2013.01); *H01L 21/67271* (2013.01); *H01L 21/681* (2013.01)

(58) Field of Classification Search
CPC ............ G01R 31/2853; G01R 31/3025; G01R 31/315; H01L 21/67271; H01L 21/67259; H01L 21/681
See application file for complete search history.

(56) References Cited

U.S. PATENT DOCUMENTS

| | | | |
|---|---|---|---|
| 7,043,388 B2 | 5/2006 | Cram | |
| 7,764,366 B2 * | 7/2010 | Moore | H01L 21/67132 356/235 |
| 7,952,375 B2 | 5/2011 | Eldridge et al. | |
| 9,733,304 B2 | 8/2017 | Gandhi et al. | |
| 2004/0100277 A1 | 5/2004 | Tam | |
| 2011/0006794 A1 | 1/2011 | Sellathamby et al. | |
| 2011/0121366 A1 * | 5/2011 | Or-Bach | H01L 21/8221 257/204 |
| 2012/0153745 A1 * | 6/2012 | Pagani | H01L 23/66 307/104 |

FOREIGN PATENT DOCUMENTS

| | | |
|---|---|---|
| CN | 101256215 A | 10/2012 |
| CN | 101790690 A | 3/2013 |
| CN | 12016615 A | 8/2014 |
| CN | 102590729 A | 10/2014 |
| CN | 1975345 A | 6/2015 |
| CN | 103115634 A | 7/2015 |
| CN | 102460686 A | 1/2016 |
| CN | 103890939 A | 3/2017 |
| WO | 99/32893 A1 | 7/1999 |
| WO | 2009/099122 A1 | 8/2009 |

OTHER PUBLICATIONS

South China University of Technology Press, "Microwave Technology and Microwave Circuit National Planning, Textbook in the 11th Five-year Plan of General Higher Education", Pub. Mar. 31, 2007, pp. 230.

Chinese Second Office Action for Application No. 201811488517.4, dated Aug. 10, 2021, 30 pages.

* cited by examiner

INDUCTIVE TESTING PROBE APPARATUS FOR TESTING SEMICONDUCTOR DIE AND RELATED SYSTEMS AND METHODS

CROSS-REFERENCE TO RELATED APPLICATION

This application is a divisional of U.S. patent application Ser. No. 15/839,559, filed Dec. 12, 2017, now U.S. Pat. No. 10,852,344, issued Dec. 1, 2020 the disclosure of which is hereby incorporated herein in its entirety by this reference.

FIELD

Embodiments of the present disclosure relate generally to an inductive testing probe apparatus for testing semiconductor die and related systems and methods.

BACKGROUND

Semiconductor die are conventionally made in large area wafers such that hundreds or thousands of identical individual die are simultaneously made. Such die may comprise diodes, transistors, metal-oxide semiconductor field-effect transistors, insulated-gate bipolar transistors, etc. After being formed, the die of the wafer may be tested for certain characteristics via a testing apparatus (typically called "wafer probe" or "probe" test). Typical die testing includes optical testing, or electrical testing by contacting the dies with probe needles. Die which fail the probe test for any reason are normally marked for removal.

Die which pass the probe test in the wafer are often damaged, particularly on the bond pads and under bump metallization (UBM) contacted by the probe needles, when electrically tested. Furthermore, oftentimes, via the optical testing, die which have only minor cosmetic damage are marked for removal. Due to the testing limitations and inaccuracies discussed above during wafer probing, some die pass the wafer probe and are treated as "good die" when, in fact, the die are defective. Conversely, some die fail wafer probe test and are treated as bad die when, in fact, the die are "good die."

As a result, good die may be discarded and improperly unmarked "good" die are frequently assembled in package form and defects discovered only when the packaged device is fully tested. The foregoing can result in a wasteful process since good die are discarded and the defective die are discovered only after the costly packaging operation is completed.

DETAILED DESCRIPTION

The illustrations presented herein are not actual views of any particular testing probe device, but are merely idealized representations employed to describe example embodiments of the present disclosure. The following description provides specific details of embodiments of the present disclosure in order to provide a thorough description thereof. However, a person of ordinary skill in the art will understand that the embodiments of the disclosure may be practiced without employing many such specific details. Indeed, the embodiments of the disclosure may be practiced in conjunction with conventional techniques employed in the industry. In addition, the description provided below does not include all elements to form a complete structure or assembly. Only those process acts and structures necessary to understand the embodiments of the disclosure are described in detail below. Additional conventional acts and structures may be used. Also note, any drawings accompanying the application are for illustrative purposes only, and are thus not drawn to scale. Additionally, elements common between figures may have corresponding numerical designations.

As used herein, the terms "comprising," "including," and grammatical equivalents thereof are inclusive or open-ended terms that do not exclude additional, un-recited elements or method steps, but also include the more restrictive terms "consisting of," "consisting essentially of," and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, the term "configured" refers to a size, shape, material composition, and arrangement of one or more of at least one structure and at least one apparatus facilitating operation of one or more of the structure and the apparatus in a predetermined way.

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein the term "wafer" means and includes not only conventional, substantially circular wafers of semiconductor material, but also bulk substrates comprising a layer of semiconductor material residing on an underlying supporting substrate of, for example, glass or ceramic.

Embodiments of the present disclosure include a testing probe apparatus that provides a "no touch" method of electrically testing semiconductor die of a wafer. In particular, the testing probe apparatus may provide a method of electrically testing semiconductor die of a wafer without physically contacting the semiconductor die. For example, the testing probe apparatus may be utilized to determine in real time known good of a wafer via a "touchless" process of screening 3D interconnect (hereinafter "3DI") structures comprising, for example, pillars, through-silicon vias, and pad structures of a semiconductor die. The testing probe apparatus may include a first probe interface, a second probe interface, and a test controller. The first and second probe interfaces may be operably coupled to the test controller. The first probe interface may include a voltage source and a first inductor. The second probe interface may include a voltage sensor and a second inductor. The voltage source may by coupled to the first inductor in order to cause a voltage across the first inductor, and as a result, and to cause the first inductor to emit an electromagnetic field around the first inductor. The voltage sensor may be coupled to the second inductor in order to sense (e.g., detect) a voltage across the second inductor.

In operation, the first probe interface may be positioned on a first side of a die, and the first inductor of the first probe interface may be positioned proximate to a first side of a 3DI structure of the die. Additionally, the second probe interface may be positioned on a second side of the 3DI structure of the die, and the second inductor of the second probe interface may be positioned proximate to a second side of the 3DI structure. Both the first and second probe interfaces may be positioned without contacting the 3DI structure.

Upon positioning the first and second probe interfaces, the test controller may cause the voltage source to initiate a voltage across the first inductor, and as a result, the first inductor to emit an electromagnetic field around the first inductor. Causing an electromagnetic field to be emitted from the first inductor, which is proximate to the 3DI structure, may initiate a voltage within the 3DI structure of the die. Furthermore, the test controller may activate (e.g., power on) the voltage sensor, and the voltage sensor may detect a voltage or a lack of a voltage across the second inductor and, as a result, a voltage or a lack of a voltage within the 3DI structure. The voltage sensor may communicate the detected voltage to the test controller. Furthermore, based on the detected voltage, the test controller may determine electrical performance data (e.g., the detected voltage, detected resistances, pillar feedback, open shorts, current, etc.). Based on the electrical performance data, the test controller of the testing probe may determine whether the 3DI structure of the die includes defects that may influence (e.g., influence detrimentally) a performance of the die. As a result, the testing probe may determine known good die in real time.

The testing probe apparatus of the present disclosure may be advantageous over conventional testing probes (e.g., optical testing probes). For example, unlike conventional testing probes, such as optical testing probes, that kill potentially good die (e.g., mark die for removal) due to cosmetic defects, the testing probe apparatus of the present disclosure avoids killing dies based on mere cosmetic defects. Furthermore, because the testing probe apparatus of the present disclosure electrically tests die, the testing probe apparatus avoids estimating actual electrical effect of defects based on appearances of the defects. Moreover, the testing probe apparatus of the present disclosure avoids killing die due to nuisance defects and inspection noise. Stated another way, the testing probe apparatus of the present disclosure reduces die overkill, which is common in conventional optical methods of die screening. As a result, the testing probe apparatus of the present disclosure may provide a more accurate testing process in comparison to conventional testing processes.

Additionally, because the testing probe apparatus of the present disclosure avoids physically contacting the die, damage to die during testing is avoided. The foregoing may result in increased costs savings and reduced processing procedures. Therefore, the testing probe apparatus may provide a more efficient and effective testing process in comparison to conventional testing processes.

In some embodiments, a testing probe apparatus for testing at least one die comprises at least one first inductor for positioning on a first side of at least one 3DI structure of the at least one die, a voltage source operably coupled to the at least one first inductor, at least one second inductor for positioning on a second opposite side of the at least one 3DI structure of the at least one die, and a voltage sensor operably coupled to the at least one second inductor, wherein the at least one first inductor is configured to generate a magnetic field responsive to the voltage source to cause a voltage within the 3DI structure and the voltage sensor is configured to detect a voltage within the 3DI structure via the at least one second inductor.

Figure 1:
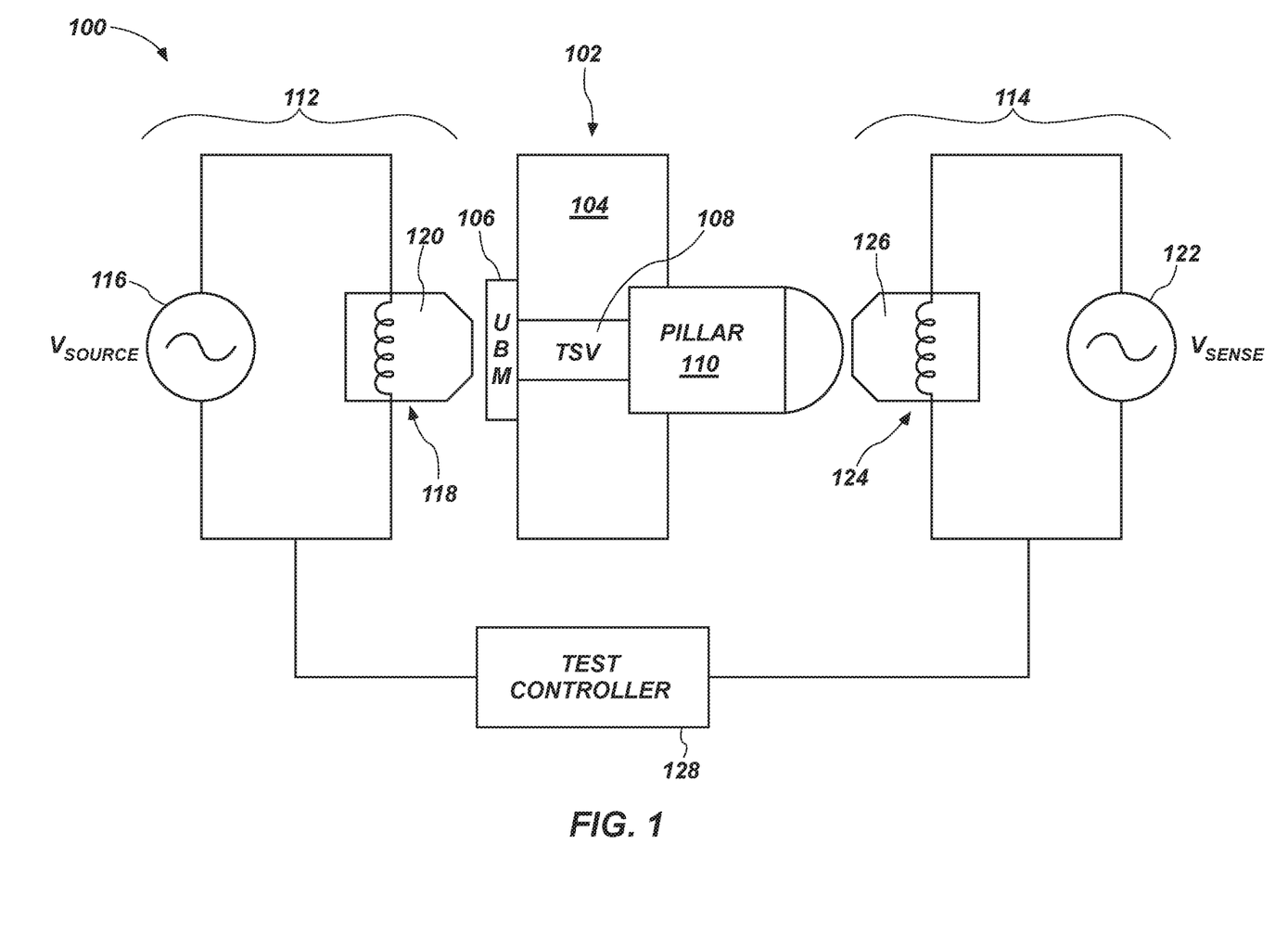
FIG. 1 shows a schematic view of a testing probe according to one or more embodiments of the present disclosure.

FIG. 1 shows a schematic diagram of a testing probe apparatus 100 according to one or more embodiments of the present disclosure. As is discussed in greater detail below, the testing probe apparatus 100 may be utilized to determine known good die (hereinafter "KGD") in real time of either singulated or unsingulated die of a wafer via a "touchless" process of screening 3D interconnect (hereinafter "3DI") structures comprising pillars, through-silicon vias, and pad structures. As used herein, the term "known good die" refer to a die that, based on test results, meets quality parameters defined based on intended use(s) of the die. For example, the term "known good die" or "KGD" can refer to a die that is at least substantially free of defects that influence performance of the die (e.g., defects that could render a chip within a multi-chip package useless).

In one or more embodiments, the testing probe apparatus 100 may be utilized to test at least one die including at least one 3DI structure 102, either on a stand-alone basis or (singulated or unsingulated) within a larger substrate 104 (e.g., a wafer). The 3DI structures 102 may each include an under bump metallization 106 (e.g., a multilayer pad for receiving a solder mass thereon) (hereinafter "UBM"), a through-silicon via 108 (hereinafter "TSV"), and a pillar 110. As will be recognized by one of ordinary skill in the art, the TSV may at least partially extend through the substrate 104 and may be in physical and electrical contact with the pillar 110 and the UBM 106. The UBM 106 may be disposed on a first side of the substrate 104, and the pillar 110 may be disposed on a second opposite side of the substrate 104. Furthermore, the pillar 110, in some embodiments, may extend at least partially into the substrate 104. As a result, each of the UBM 106 and the pillar 110 may be at least partially exposed and accessible by the testing probe apparatus 100. For example, the 3DI structures 102 may include any 3DI structure known in the art. For instance, although a particular configuration of 3DI structure 102 is disclosed herein as an example, the one of ordinary skill in the art will readily recognize that the testing probe apparatus 100 may be utilized to test any die (pre and post singulation) known in the art. Accordingly, the foregoing description of the 3DI structure 102 is only described herein in order to facilitate description of the testing probe apparatus 100 with its related structures and function.

In some embodiments, the testing probe apparatus 100 may include a first probe interface 112, a second probe interface 114, and a test controller 128. The first and second probe interfaces 112, 114 may be operably coupled to the test controller 128. The first probe interface 112 may include a voltage source 116, a first inductor 118 (at least one first inductor), and a first body of dielectric material 120. The second probe interface 114 may include a voltage sensor 122, a second inductor 124 (at least one second inductor), and a second body of dielectric material 126. The voltage source 116 may by coupled to the first inductor 118 (via traces, wires, etc.) in order to cause a voltage across the first inductor 118, and as a result, and cause the first inductor 118 to emit an electromagnetic field around the first inductor 118. In one or more embodiments, the voltage source 116 may comprise a battery or a surge-protected online voltage source. In one or more embodiments, the voltage source 116 may comprise a component separate from the first probe interface 112 and operably connected thereto.

The first body of the dielectric material 120 may at least substantially surround at least a distal tip (a first distal tip) of the first inductor 118. The second body of dielectric material may at least substantially surround at least a distal tip (a second distal tip) of the second inductor 124. The voltage sensor 122 may be coupled to the second inductor 124 (via traces, wires, etc.) in order to sense (e.g., detect) a voltage across the second inductor 124. Furthermore, the voltage sensor 122 may include a voltage sensor circuit (i.e., a device that converts voltage measured between two points of an electrical circuit into a physical signal proportional to the sensed voltage). In one or more embodiments, the voltage sensor 122 may comprise a component separate from the second probe interface 114 and operably connected thereto.

Furthermore, although the voltage source 116 and the voltage sensor 122 are describe herein as being part of the first and second probe interfaces 112, 114, respectively, the disclosure is not so limited. Rather, in some embodiments, the voltage source 116 and the voltage sensor 122 may be separate (e.g., separate components) from the first and second probe interfaces 112, 114.

Referring still to FIG. 1, in additional embodiments, the first probe interface 112 and the second probe interface 114 may include energy sources and energy sensors other than voltage sources and sensors. For example, the first probe interface 112 and the second probe interface 114 may include a current source and a current sensor, respectively, instead of a voltage source and voltage sensor. In further embodiments, the first probe interface 112 may include a current source and the second probe interface 114 may include a voltage sensor. In yet further embodiments, the first probe interface 112 may include a voltage source and the second probe interface 114 may include a current sensor. Referring still to FIG. 1, in some embodiments, the voltage source 116 and the voltage sensor 122 may be switched. For example, the first probe interface 112 may include a voltage sensor, and the second probe interface 114 may include a voltage source.

In one or more embodiments, the first and second inductors 118, 124 may include one or more of an air core inductor, an iron core inductor, a ferrite core inductor, an iron powder inductor, a laminated core inductor, a bobbin based inductor, a toroidal inductor, a multi-layer ceramic inductor, a film inductor, a variable inductor, or a coupled inductor.

The first and second bodies of dielectric material 120, 126 (i.e., insulative materials) may be sized and shaped and of sufficiently small thickness to enable the first and second inductors 118, 124 to be disposed sufficiently proximate to the die (e.g., the 3DI structures 102 of the die) without contacting the 3DI structures 102 in order to initiate a voltage within the 3DI structures 102 and detect a voltage within the 3DI structures 102. Furthermore, the dielectric material of the first and second bodies of dielectric material 120, 126 may include one or more of polyimide, benzocyclobutene, polybenzoxazole, spin-on-glass, thermal oxide, PARYLENE™ polymer, low silane oxide, a pulse deposition layer comprising aluminum-rich oxide, silicon dioxide, silicon nitride, silicon oxynitride, a glass (i.e., borophosphosilicate glass, phosphosilicate glass, or borosilicate glass), BT resin, a ceramic, or any dielectric material.

The test controller 128 may include a central processing unit ("CPU") that is programmed with instructions in order to operate the first probe interface 112 and the second probe interface 114. For example, the test controller 128 may, via the CPU, operate the voltage source 116 and the voltage sensor 122 of the first and second probe interfaces 112, 114. In particular, during a testing procedure, the test controller 128 may provide an output signal (a first output signal) to the voltage source 116 to activate the voltage source 116, and as a result, may cause a magnetic field to be generated around the first inductor 118. Furthermore, the test controller 128 may provide an output signal (a second output signal) to the voltage sensor 122 to activate the voltage sensor 122. Moreover, the test controller 128, via the output signal, may cause the voltage sensor 122 to sense a voltage across the second inductor 124. Furthermore, the test controller 128 may also receive input signals (e.g., electrical performance data) from the first and second probe interfaces 112, 114. For example, in some embodiments, the test controller 128 may receive an input signal from the voltage sensor 122 indicating a sensed voltage within a 3DI structure of the die. In additional embodiments, depending on the energy source and energy sensor of the first and second probe interfaces 112, 114, the test controller 128 may receive input signals indicating one or more of detected currents, detected resistances, pillar feedback, open shorts, etc.

Moreover, as mentioned above, responsive to the received input signals, the test controller 128 may process the signals and may utilize the signals and indicated information (e.g., detected voltages, detected currents, detected resistances, pillar feedback, open shorts) to determine whether a given tested die is a KGD.

In operation, the first probe interface 112 may be positioned on a first side of the 3DI structure 102 of the die (e.g., of at least one die), and the first inductor 118 of the first probe interface 112 may be positioned proximate to the UBM 106 of the 3DI structure 102 of the die. Additionally, the second probe interface 114 may be positioned on a second side of the 3DI structure 102 of the die, and the second inductor 124 of the second probe interface 114 may be positioned proximate to the pillar 110 of the 3DI structure 102 of the die. Both the first and second probe interfaces 112, 114 may be positioned without contacting the 3DI structure 102 of the die.

Upon positioning the first and second probe interfaces 112, 114, the test controller 128 may cause the voltage source 116 to generate a voltage across the first inductor 118, and as a result, the first inductor 118 to generate an electromagnetic field around the first inductor 118 responsive to the voltage source. Causing an electromagnetic field to be generated from the first inductor 118, which is proximate to the 3DI structure 102 of the die, may initiate a voltage within the 3DI structure 102 of the die.

Furthermore, the test controller 128 may activate (e.g., power on) the voltage sensor 122, and the voltage sensor 122 may sense a voltage or a lack of a voltage across the second inductor 124 and, as a result, a voltage or a lack of a voltage within the 3DI structure 102 of the die. The voltage sensor 122 may communicate the detected voltage to the test controller 128. Furthermore, based on the detected voltage, the test controller 128 may determine electrical performance data (e.g., the detected voltage, detected resistances, pillar feedback, open shorts, current, etc.). Based on a comparison of the electrical performance data to known parameters, the test controller 128 of the testing probe apparatus 100 may grade a given die. Moreover, as is discussed in greater detail below, grading the given die may enable the given die to be sorted and combined with other die by grade. Furthermore, based on the grade of a given die, the test controller 128 may determine whether the die is a KGD for the intended application. In particular, based on the grade, the test controller 128 of the testing probe apparatus 100 can determine whether the 3DI structures 102 of the die include defects that may influence performance of the die.

If, based on the grade of a given die, the test controller 128 determines that defects of the 3DI structures 102 of the given die do negatively influence performance of the given die, the test controller 128 can identify (e.g., mark or map) the given die as dead or of a lower grade. For example, the test controller 128 may kill the die, as is known in the art. If, on the other hand, the test controller 128 determines that defects (or the lack thereof) of the 3DI structures 102 of the given die do not negatively influence performance of the die, the test controller 128 can identify (e.g., mark or map) the given die as a known good die.

In some embodiments, a testing probe apparatus for testing at least one die comprises at least one first inductor for positioning on a first side of at least one 3DI structure of the at least one die, a voltage source operably coupled to the at least one first inductor, at least one second inductor for positioning on a second opposite side of the at least one 3DI structure of the at least one die, and a voltage sensor operably coupled to the at least one second inductor, wherein the at least one first inductor is configured to generate a magnetic field responsive to the voltage source to cause a voltage within the 3DI structure and the voltage sensor is configured to detect a voltage within the 3DI structure via the at least one second inductor.

Figure 2:
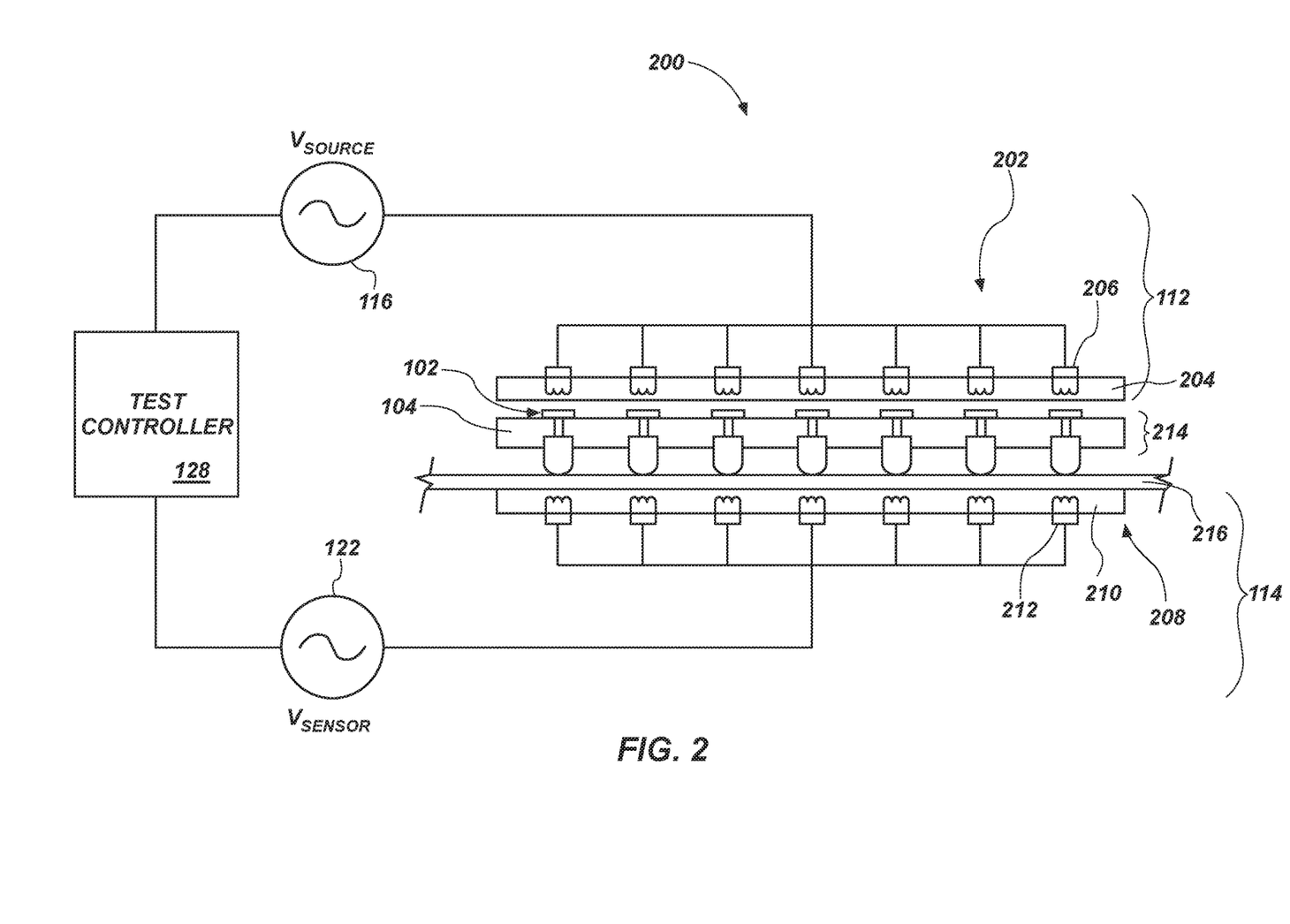
FIG. 2 shows a schematic view of a testing probe according to one or more embodiments of the present disclosure.

FIG. 2 shows a testing probe system 200 according to embodiments of the present disclosure. As shown, the testing probe system 200 may include a first probe interface 112, a second probe interface 114, and a test controller 128. The first and second probe interfaces 112, 114 may be operably coupled to the test controller 128. The first probe interface 112 may include a voltage source 116 and a first probe card 202. The first probe card 202 may include a card portion 204 and a first array of inductors 206. The card portion 204 may include a dielectric material such as any of the dielectric materials discussed above. Each inductor 206 of the first array of inductors 206 may be at least partially disposed within the card portion 204. Furthermore, a pattern of the first array of inductors 206 may correlate to a pattern of a plurality of 3DI structures 102 of at least one die of a wafer 214 to be tested. For example, each inductor 206 of the first array of inductors 206 may correlate to a 3DI structure 102 of the plurality of 3DI structures 102 of the at least one die of the wafer 214.

The second probe interface 114 may include a voltage sensor 122 and a second probe card 208. The second probe card 208 may include a card portion 210 and a second array of inductors 212. The card portion 210 may include a dielectric material such as any of the dielectric materials discussed above. Each inductor 212 of the second array of inductors 212 may be at least partially disposed within the card portion 210. Furthermore, a pattern of the second array of inductors 212 may correlate to the pattern of the plurality of 3DI structures 102 of the at least one die of the wafer 214 to be tested. Moreover, the pattern of the second array of inductors 212 may correlate to the pattern of the first array of inductors 206. For example, each inductor 212 of the second array of inductors 212 may correlate to a 3DI structure 102 of the plurality of 3DI structures 102 of the at least one die and an inductor 206 of the first array of inductors 206.

In some embodiments, the testing probe system 200 may be utilized to test wafers (e.g., wafer 214) supported by a film 216 supported by a film frame (not shown) as a carrier. In further embodiments, the testing probe system 200 may be utilized to test wafers (e.g., wafer 214) supported by other carriers such as foam and paper carriers. Furthermore, the testing probe system 200 may enable full wafer testing pre- or post-die singulation (i.e., cutting a wafer containing multiple integrated circuits into individual dies each comprising self-contained integrated circuits). As a result, the testing probe system 200 may enable wafers to be tested at an end of a processing line (e.g., a processing line for fabricating the die) and immediately prior to a pick and place operation to dispose die on higher-level packaging or in a stack with other die.

The testing probe system 200 may operate in the same manner described above in regard to FIG. 1. For example, the testing probe system 200 may individually activate each inductor of the first array of inductors 206. In some embodiments, the testing probe system 200 may activate each inductor of the first array of inductors 206 sequentially (e.g., along a pattern of the array). In additional embodiments, the testing probe system 200 may activate non-adjacent inductors of the first array of inductors 206 sequentially in order to avoid interference from adjacent inductors of the first array of inductors 206. In one or more embodiments, the testing probe system 200 may activate multiple non-adjacent inductors of the first array of inductors 206 simultaneously to test multiple 3DI structures 102 of a die at the same time. Furthermore, the test controller 128 may receive individual signals (e.g., the detected voltages) from each of the inductors 212 of the second array of inductors 212 of the second probe card 208 via the voltage sensor 122. The test controller 128 may determine electrical performance data from the detected voltages for each individual 3DI structure 102 of each die of the wafer 214. Based on the electrical performance data of the 3DI structures 102 of each die of the wafer 214, the test controller 128 may determine which die of the wafer 214 are KGD and which die, if any, of the wafer 214 have defects that may influence performance. As a result, the test controller 128 can identify (e.g., mark or map) the tested die as a KGD or dead die. Furthermore, as discussed above, based on the foregoing determination, the die of the wafer 214 can be sorted based on grade.

Figure 3:
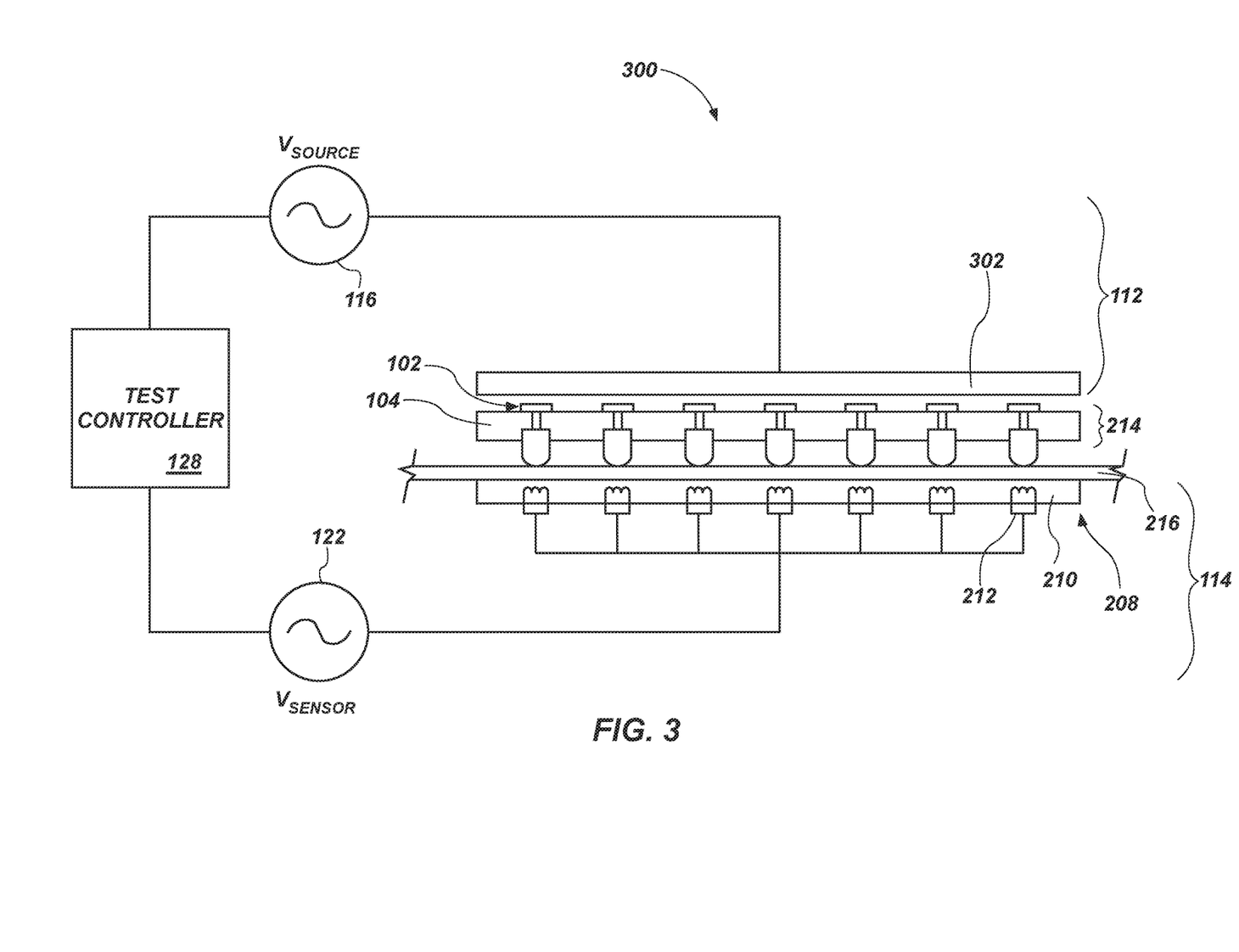
FIG. 3 shows a schematic view of a testing probe according to one or more embodiments of the present disclosure.

FIG. 3 shows schematic representation of a testing probe system 300 according to embodiments of the present disclosure. As shown, the testing probe system 300 may include a first probe interface 112, a second probe interface 114, and a test controller 128. The first and second probe interfaces 112, 114 may be operably coupled to the test controller 128. The first probe interface 112 may include a voltage source 116 and a probe card 302. The probe card 302 may comprise a voltage biased probe card. For example, the voltage source 116 may apply a predetermined voltage across at least substantially an entirety of the probe card 302. For instance, in some embodiments, the probe card 302 may include a single inductor sized and shaped to initiate a voltage in each 3DI structure 102 of each die of the wafer 214. In additional embodiments, the probe card 302 may include a suitable biasing electronic circuit as known in the art.

Similar to the testing probe system 200 described above in regard to FIG. 2, the second probe interface 114 may include a voltage sensor 122 and a second probe card 208. The second probe card 208 may include a card portion 210 and an array (e.g., a second array) of inductors 212. The card portion 210 may include a dielectric material such as any of the dielectric materials discussed above. Each inductor 212 of the second array of inductors 212 may be at least partially disposed within the card portion 210. Furthermore, a pattern of the second array of inductors 212 may correlate to the pattern of the plurality of 3DI structures 102 within one or more die of the wafer 214 to be tested. For example, each inductor 212 of the second array of inductors 212 may correlate to a 3DI structure 102 of the plurality of 3DI structures 102 of one or more die of the wafer 214.

The testing probe system 300 may operate in the same manner described above in regard to FIG. 1. Furthermore, the test controller 128 may receive individual signals (e.g., the detected voltages) from each of the inductors 212 of the second array of inductors 212 of the second probe card 208 via the voltage sensor 122. The test controller 128 may determine electrical performance data from the detected voltages for each individual 3DI structure 102 of the one or more die of the wafer 214. Based on the electrical performance data, the test controller 128 may determine which die of the wafer 214 are KGD and which die, if any, of the wafer 214 have defects that may influence performance. As a result, the test controller 128 can identify (e.g., mark) the tested die as KGD or dead die. Furthermore, as discussed above, based on the foregoing determination, the die of the wafer 214 can be sorted based on grade.

Referring still to FIG. 3, although the first probe interface 112 is described herein as including a biased probe card 302, in alternative embodiments, the first probe interface 112 may include a voltage sensor and a first array of inductors, and the second probe interface 114 may include a biased probe card 302.

Figure 4:
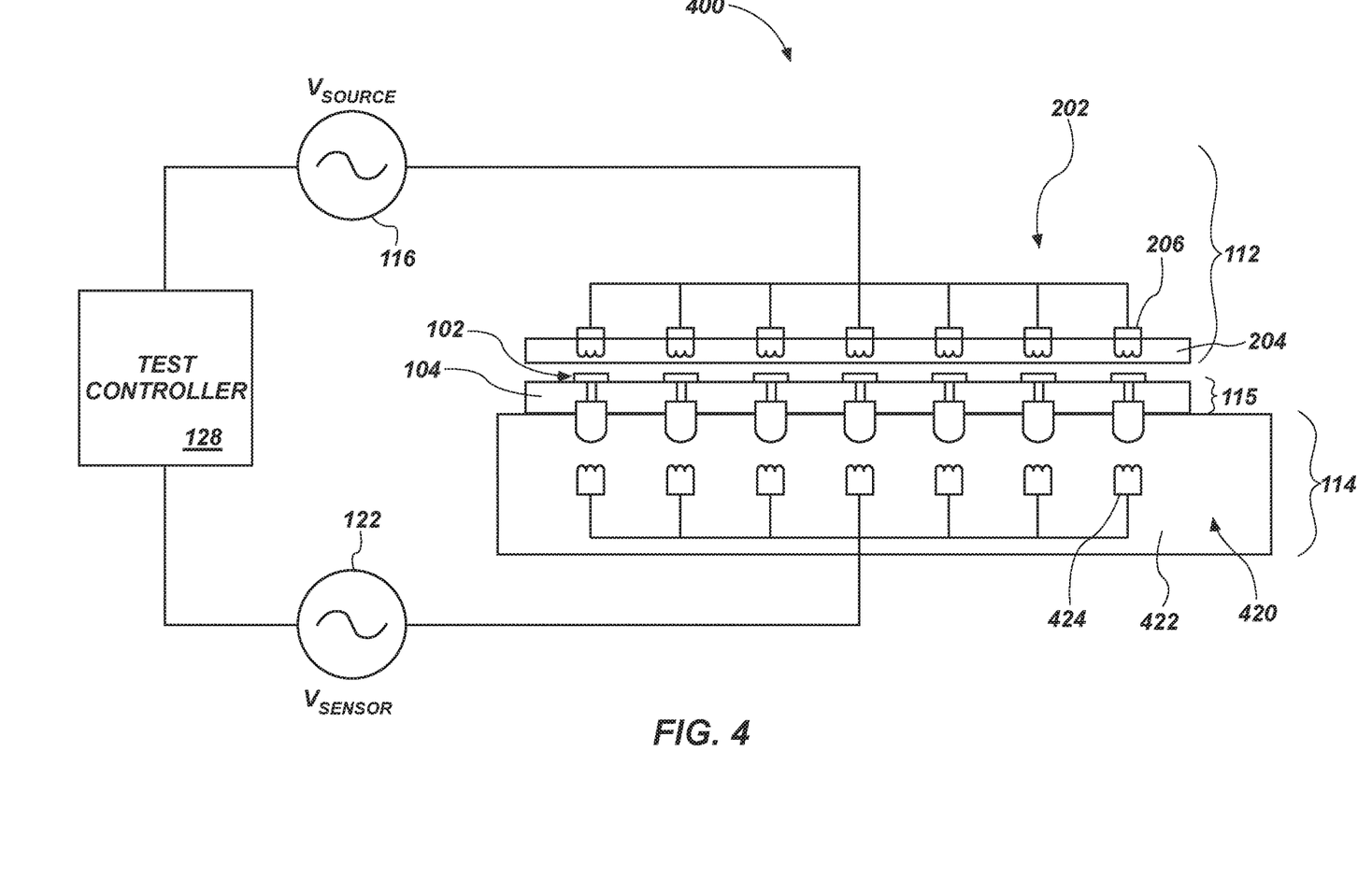
FIG. 4 shows a schematic view of a testing probe according to one or more embodiments of the present disclosure.

FIG. 4 shows a schematic representation of a testing probe system 400 according to additional embodiments of the present disclosure. As shown, the testing probe system 400 may include first probe interface 112, a second probe interface 114, and a test controller 128. The first and second probe interfaces 112, 114 may be operably coupled to the test controller 128. The first probe interface 112 may include a voltage source 116 and a first probe card 202. The first probe card 202 may include a card portion 204 and a first array of inductors 206. The card portion 204 may include a dielectric material such as any of the dielectric materials discussed above. Each inductor 206 of the first array of inductors 206 may be at least partially disposed within the card portion 204. Furthermore, a pattern of the first array of inductors 206 may correlate to a pattern of a plurality of 3DI structures 102 within one or more die of the wafer 214 to be tested. For example, each inductor 206 of the first array of inductors 206 may correlate to a 3DI structure 102 of the plurality of 3DI structures 102 of one or more die of the wafer 214.

The second probe interface 114 may include a voltage sensor 122 and a smart wafer carrier 420, which may include a temporary wafer support system during die processing. The smart wafer carrier 420 may include a wafer carrier 422 and an array (e.g., a second array) of inductors 424. The wafer carrier 422 may include a dielectric material such as any of the dielectric materials discussed above. Furthermore, in some embodiments, the wafer carrier 422 may include a cavity carrier (i.e., a carrier including a plurality of cavities for receiving a plurality of pillars of the plurality of 3DI structures 102) of the one or more die. Moreover, the wafer carrier 422 may comprise any wafer carriers known in the art such as a wafer chuck.

Each inductor 424 of the second array of inductors 424 may be at least partially disposed within the wafer carrier 422. Furthermore, a pattern of the second array of inductors 424 may correlate to the pattern of a plurality of 3DI structures 102 of one or more die of the wafer 214 to be tested. For example, each inductor 424 of the second array of inductors 424 may correlate to a 3DI structure 102 of the plurality of 3DI structures 102 of one or more die.

Referring still to FIG. 4, although the voltage sensor 122 is shown outside of the smart wafer carrier 420, the disclosure is not so limited. Rather, in some embodiments, the voltage sensor 122 may be disposed within the smart wafer carrier 420. Furthermore, although the smart wafer carrier 420 is shown as including the voltage sensor 122, the opposite is within the scope of the present disclosure. For example, the smart wafer carrier 420 may include a voltage source 116, and the first probe card 202 may include a voltage sensor 122.

The testing probe system 400 may operate in the same manner described above in regard to FIG. 1. For example, the test controller 128 may receive individual signals (e.g., the detected voltages) from each of the inductors 424 of the second array of inductors 424 of the smart wafer carrier 420 via the voltage sensor 122. The test controller 128 may determine electrical performance data from the detected voltages for each individual 3DI structure 102 of the one or more die of the wafer 214. Based on the electrical performance data, the test controller 128 may determine which die of the wafer 115 (see FIG. 4) are KGD and which die, if any, of the wafer 115 have defects that may influence (e.g., detrimentally influence) performance of the die. As a result, the test controller 128 can identify (e.g., mark) the tested die as KGD or dead die. Furthermore, as discussed above, based on the foregoing determination, the die of the wafer 115 can be sorted based on grade.

Figure 5:
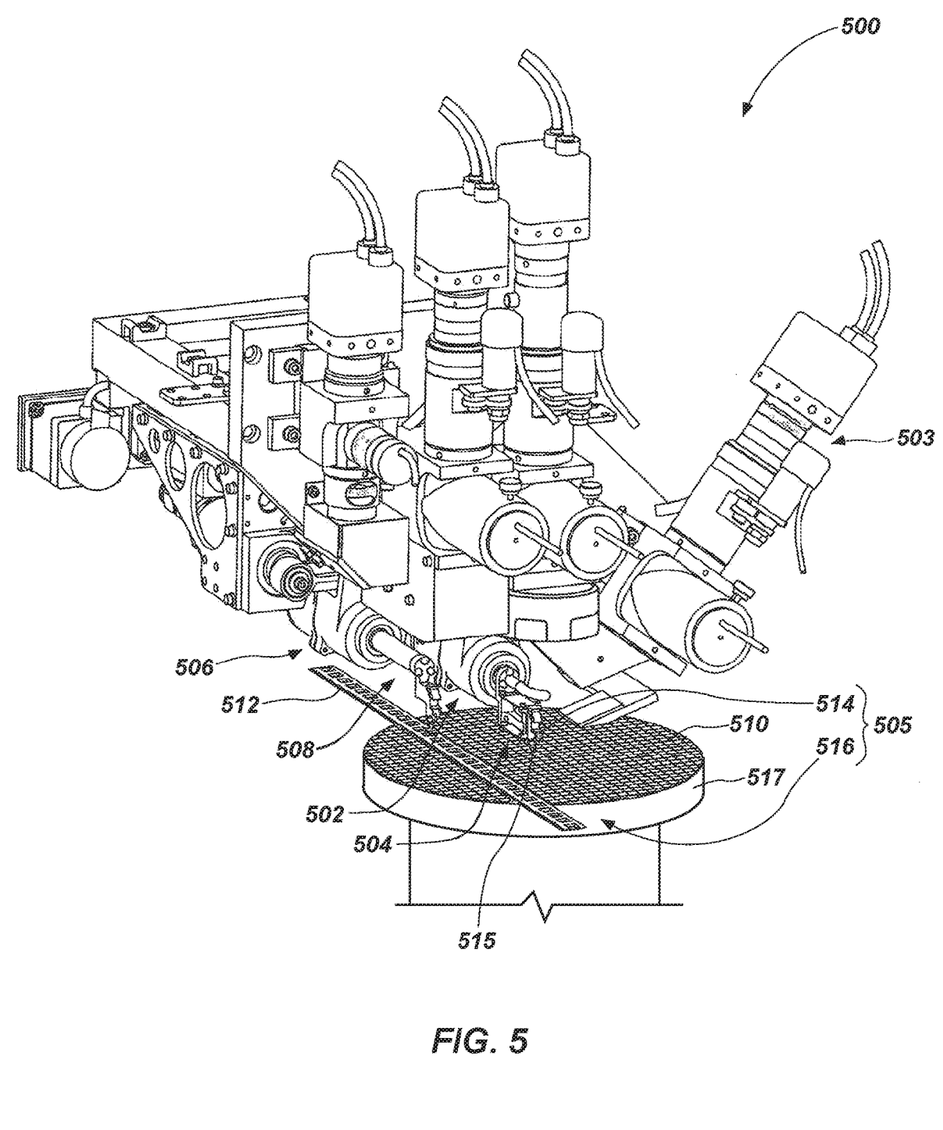
FIG. 5 shows a die sorter utilizing a testing probe according to one or more embodiments of the present disclosure.

FIG. 5 shows a perspective view of a die sorter 500 according to one or more embodiments of the present disclosure. The die sorter 500 may include a pick arm assembly 502, a place arm assembly 506, an optical inspection system 503, and a wafer testing probe 505. The pick arm assembly 502 may include a pick arm 504, and the place arm assembly 506 may include a place arm 508. In operation, the pick arm 504 and the place arm 508 may cooperate to remove singulated die from a wafer 510 (e.g., a semiconductor wafer) and transfer such individual die to a tape 512 (e.g., a pocket tape as is known in the art). The optical inspection system 503 may include a pick align/inspection camera, a handoff alignment/inspection camera, and a place alignment/inspection camera.

The wafer 510 may be disposed on a wafer support carrier 517 (e.g., a wafer chuck). The pick arm assembly 502 and the place arm assembly 506 may be mounted to an X-axis linear drive assembly. For example, the pick arm assembly 502 and the place arm assembly 506 may operate in substantially the same manner as described in U.S. patent application Ser. No. 11/485,193, to Moore et al., filed Jul. 11, 2006, the disclosure of which is incorporated in its entirety by reference herein. Furthermore, the optical inspection system 503 may operate in substantially the same manner as described in the foregoing application.

The wafer testing probe 505 may include a first probe interface 514 and a second probe interface 516. The first probe interface 514 and the second probe interface 516 may be operably coupled to a test controller 128 (e.g., FIG. 1). The first probe interface 514 may include an array of inductors 515 correlating to a pattern or a portions of a pattern of a plurality of 3DI structures 102 within die of wafer 510 and a voltage source 116 (FIG. 1). For example, the first probe interface 514 may include the first probe interface 112 operable as described above in regard to FIG. 1. The inductors 515 of the first probe interface 514 may be disposed within a distal end of the pick arm 504. For instance, the inductors 515 of the first probe interface 514 may be carried by a portion of the pick arm 504 designated for contacting a die from the wafer 510 when picking up the die.

The second probe interface 516 may be disposed within the wafer support carrier 517. In some embodiments, the second probe interface 516 may include an array of inductors 424 (FIG. 4) and a voltage sensor 122 (FIG. 4) coupled to the array of inductors 424 (FIG. 4). For example, the second probe interface 516 may include the smart carrier described above in regard to FIG. 4.

Referring to FIGS. 1 and 5 together, in operation, during an act of picking up a given die from the wafer 510, the test controller 128 may cause the voltage source 116 to create a voltage across individual inductors (for example, sequentially) of the first probe interface 514. As a result, the inductors may generate electromagnetic fields and may initiate a voltage within the 3DI structures of a given die of the wafer 510.

Furthermore, the test controller 128 may activate the voltage sensor 122 of the second probe interface 516, and the voltage sensor 122 may detect a voltage or a lack of a voltage across each inductor of the array of inductors 424 (FIG. 4) correlating to a 3DI structure of the given die. As a result, the test controller 128 may determine a voltage or a lack of a voltage within the respective 3DI structures 102 of the given die. Furthermore, as discussed above, based on the determined voltages, the test controller 128 may determine electrical performance data (e.g., the detected voltage, detected resistances, pillar feedback, open shorts, current, etc.) of the 3DI structures. Based on the electrical performance data, the test controller 128 of the wafer testing probe 505 may grade the given die. Furthermore, based on the grade of the given die, the test controller 128 may determine whether the given die is a KGD.

If, on one hand, the test controller 128 determines that the given die is a KGD, the pick arm 504 and the place arm 508 may continue through an operation of picking up the die and transferring the die to the tape 512. For example, upon determining whether the at least one 3DI structure of the at least one die includes one or more defects, the test controller 128 may cause the pick arm 504 and the place arm 508 to pick up the given die and place the given die on one or more of the tape 512, another wafer, a higher level packaging, or a stacking die. If, on the other hand, the test controller 128 determines that the given die is a dead die, the die sorter 500 may discard the die or simply leave the die on the wafer 510.

Referring still to FIG. 5, although a specific die sorter 500 is shown, the disclosure is not so limited. Rather, the wafer testing probe 505 of the present disclosure may be utilized and implemented within any tape and reel, pick and place, and/or die sorters known in the art. For example, the testing probe may be utilized within devices for positioning electronic die such as the testing structures described in one or more of U.S. Pat. No. 9,733,304, to Gandhi et al., filed Sep. 24, 2014 and issued Aug. 15, 2017, the disclosure of which is incorporated in its entirety by reference herein. As another non-limiting example, the testing probe may be utilized within the testing apparatus described in one or more of U.S. Pat. No. 7,043,388, to Cram, filed Dec. 22, 2003 and issued May 9, 2006, the disclosure of which is incorporated in its entirety by reference herein. As yet another example, the testing probe may be utilized within the positioning apparatus described in one or more of U.S. Pat. No. 6,900,459, to Farnworth, filed Dec. 5, 2002 and issued May 31, 2005, the disclosure of which is incorporated in its entirety by reference herein.

In some embodiments, a testing probe system for testing die of a wafer comprises a first probe interface for positioning on a first side of at least one die of the wafer comprising 3DI structures, the first probe interface comprising a voltage source and at least one first inductor operably coupled to the voltage source. The system further comprises a carrier for supporting the wafer on an opposing side thereof from the first probe interface, and a second probe interface on an opposing side of the carrier from the first probe interface, a voltage sensor; and at least one second inductor operably coupled to the voltage sensor. The voltage source of the first probe interface is configured to inductively cause a voltage within at least one 3DI structure of the die via the at least one first inductor, and wherein the voltage sensor of the carrier is configured to detect a voltage within the at least one 3DI structure via the at least one second inductor.

In some embodiments, a testing probe system for testing die of a wafer comprises a first probe interface for positioning on a first side of at least one die of the wafer comprising 3DI structures, the first probe interface comprising an energy source and at least one first inductor operably coupled to the energy source. The system further comprises a carrier for supporting the wafer on an opposing side thereof from the first probe interface, a second probe interface on an opposing side of the carrier from the first probe interface comprising an energy sensor and at least one second inductor operably coupled to the energy sensor. The energy source of the first probe interface is configured to inductively cause energy within at least one 3DI structure of the die via the at least one first inductor, and wherein the energy sensor of the carrier is configured to detect the energy within the at least one 3DI structure via the at least one second inductor.

Figure 6:
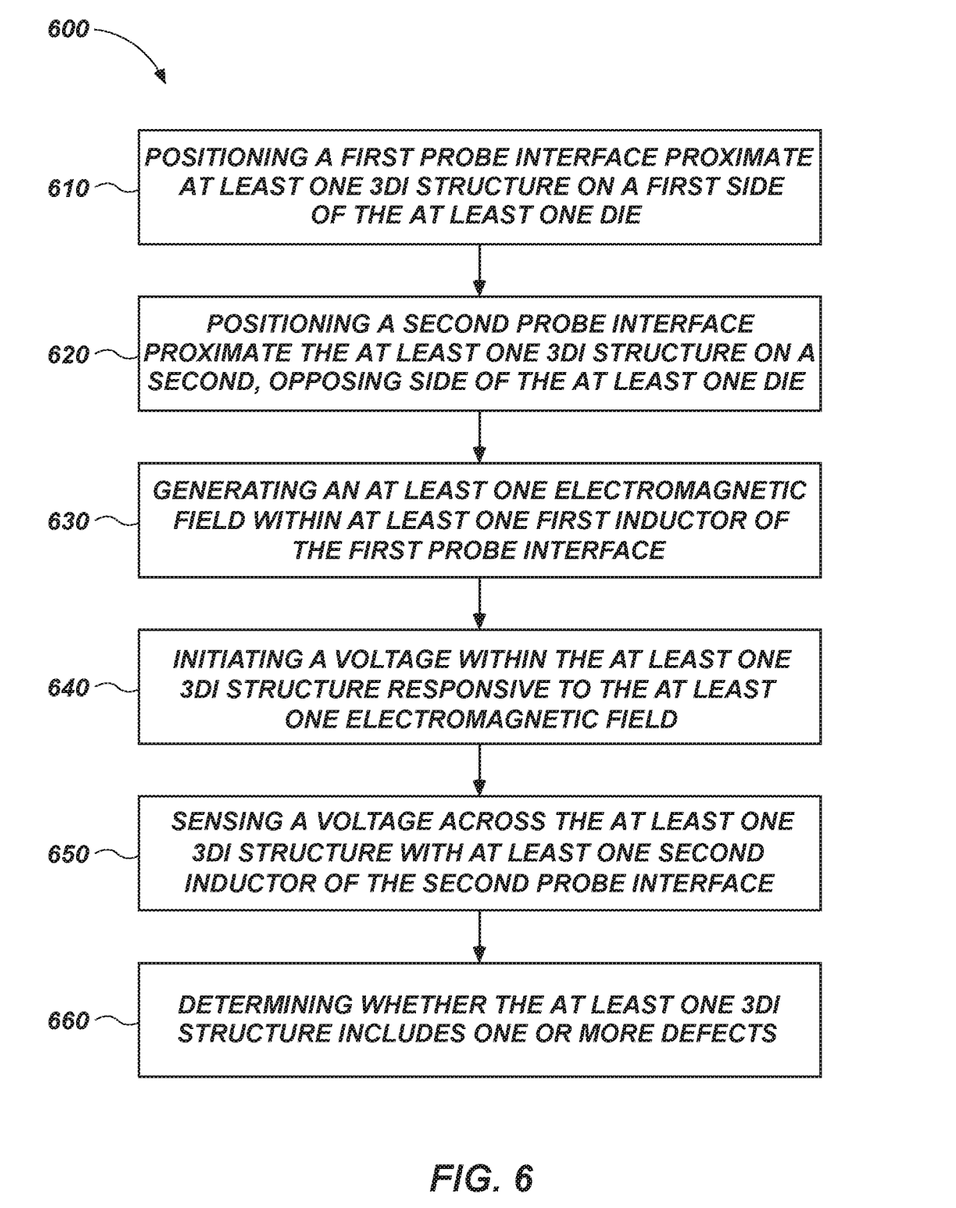
FIG. 6 shows a schematic flow diagram of a method of determining good die according to one or more embodiments of the present disclosure.

FIG. 6 shows a schematic flow chart of a method 600 of determining known good die within a substrate according to one or more embodiments of the present disclosure. The method may include an act 610 of positioning a first probe interface. For instance, the act 610 may include positioning a first probe interface proximate at least one 3DI structure on a first side of the at least one die without physically contacting the at least one 3DI structure. In some embodiments, act 610 may include positioning a first probe card carrying a first array of inductors on the first side of one or more die including a plurality of 3DI structures and aligning the first array of inductors with the plurality of 3DI structures. In additional embodiments, act 610 may include positioning a voltage biased probe card on the first side of one or more die including the plurality of 3DI structures.

The method 600 may further include an act 620 of positioning a second probe interface. For example, the act 620 of positioning a second probe interface proximate the at least one 3DI structure on a second, opposing side of the at least one die without physically contacting the at least one 3DI structure. In some embodiments, act 620 may include positioning a second probe card carrying a second array of inductors on the second side of the at least one die including the plurality of 3DI structures and aligning the second array of inductors with the plurality of 3DI structures of the at least one die. In additional embodiments, act 620 may include positioning a wafer carrier including a second array of inductors on the second side of the at least one die. For example, act 620 may include positioning a wafer chuck including the second array of inductors on the second side of the at least one die.

In some embodiments, the method 600 may include an act 630 of generating an electromagnetic field. For instance, act 630 may include generating an electromagnetic field within at least a first inductor of the first probe interface proximate the at least one 3DI structure. In one or more embodiments, act 630 may include sequentially generating an electromagnetic field within each inductor of a first plurality of inductors of the first probe interface. In additional embodiments, act 630 may include generating an electromagnetic field in a single inductor of the first probe interface.

The method 600 may also include an act 640 of initiating a voltage within the 3DI structure. In particular, act 640 may include initiating a voltage within the at least one 3DI structure of the at least one die responsive to the at least one electromagnetic field. In some instances, act 640 may include generating a voltage within each at least 3DI structure of a plurality of 3DI structures of the at least one die of a wafer.

Additionally, the method 600 may include an act 650 of sensing a voltage. For example, act 650 may include sensing a voltage across the at least one 3DI structure of the at least one die with at least a second inductor of the second probe interface. In one or more embodiments, act 650 may include sequentially sensing a voltage across each 3DI structure of a plurality of 3DI structures by sequentially sensing a voltage within each inductor of a second plurality of inductors of the second probe interface. In some embodiments, act 650 may further include determining electrical performance data from the sensed voltage. The electrical performance data may include the sensed voltage, sensed resistances, pillar feedback, open shorts, current, etc.

Furthermore, the method 600 may include an act 660 of determining whether the at least one 3DI structure include defects. For example, act 660 may include determining whether the at least one 3DI structure includes one or more defects based at least in part on the sensed voltage. In some embodiments, act 660 may include determining whether the at least one 3DI structure of a given includes defects that may influence performance of the given die. Furthermore, act 660 may include determining whether each 3DI structure of the plurality of 3DI structures of one or more die includes defects that may influence performance of the one or more die.

In one or more embodiments, the method 600 may further include grading and sorting die based on whether the 3DI structures of the die include defects. For example, the method 600 may include determining whether a given die constitutes a good die.

In some embodiments, the method 600 may further include disposing the at least one die on a carrier before positioning the first probe interface and the second probe interface. Additionally, the method 600 may include disposing a wafer comprising a number of die on a carrier comprising a film supported by a film frame before positioning the first probe interface and the second probe interface. Moreover, the method 600 may include, upon determining whether the at least one 3DI structure of the at least one die includes one or more defects, positioning the first probe interface proximate to another at least one 3DI structure on a first side of another at least one die without physically contacting the another at least one 3DI structure. Furthermore, the method 600 may include upon determining whether the at least one 3DI structure of the at least one die includes one or more defects, picking up the at least one die with a pick and place tool and placing the at least one die on one or more of a tape, a wafer, a higher level packaging, or a stacking die.

In some embodiments, a method of testing at least one die comprises positioning a first probe interface proximate at least one 3DI structure on a first side of the at least one die without physically contacting the at least one 3DI structure, positioning a second probe interface proximate the at least one 3DI structure on a second, opposing side of the at least one die without physically contacting the at least one 3DI structure, generating an at least one electromagnetic field within at least one first inductor of the first probe interface proximate the at least one 3DI structure, initiating a voltage within the at least one 3DI structure responsive to the at least one electromagnetic field, sensing a voltage across the at least one 3DI structure with at least one second inductor of the second probe interface, and determining whether the at least one 3DI structure includes one or more defects based at least in part on the sensed voltage.

While the present disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the invention as claimed, including legal equivalents thereof. In addition, features from one embodiment may be combined with features of another embodiment while still being encompassed within the scope of the disclosure as contemplated by the inventors. Further, embodiments of the disclosure have utility with different and various tool types and configurations.

What is claimed is:

1. A testing probe system comprising:
a first probe interface configured to be at least partially positioned on a first side of at least one die of a wafer comprising 3D interconnect structures, the first probe interface comprising:
an energy source; and
at least one first inductor operably coupled to the energy source; and
a carrier configured to support the wafer on a side of the wafer opposing the first probe interface; and
a second probe interface configured to be at least partially positioned on a side of the carrier opposing the first probe interface, the second probe interface comprising:
an energy sensor; and
at least one second inductor operably coupled to the energy sensor,
wherein the energy source of the first probe interface is configured to inductively generate energy within at least one 3D interconnect structure of the at least one die via the at least one first inductor, and wherein the energy sensor is configured to detect the energy within the at least one 3D interconnect structure via the at least one second inductor.

2. The testing probe system of claim 1, wherein the energy source comprises a current source, and wherein the energy sensor comprises a current sensor.

3. The testing probe system of claim 1, wherein the energy source comprises a voltage source, and wherein the energy sensor comprises a current sensor.

4. The testing probe system of claim 1, wherein the energy source comprises a current source, and wherein the energy sensor comprises a voltage sensor.

5. The testing probe system of claim 1, wherein the energy source comprises a voltage source, and wherein the energy sensor comprises a voltage sensor.

6. The testing probe system of claim 1, wherein the at least one first inductor comprises a single first inductor operably coupled to the energy source, and wherein the at least one second inductor comprises a single second inductor operably coupled to the energy sensor.

7. The testing probe system of claim 1, wherein the at least one first inductor comprises a first array of inductors operably coupled to the energy source and corresponding to a plurality of 3D Interconnect structures of the at least one die of the wafer, and wherein the at least one second inductor comprises a second array of inductors operably coupled to a voltage sensor and corresponding to the first array of inductors.

8. The testing probe system of claim 1, further comprising a pick arm configured to carry at least the at least one first inductor of the first probe interface.

9. The testing probe system of claim 1, wherein the first probe interface further comprises a dielectric material at least partially surrounding the at least one first inductor, and wherein the second probe interface further comprises a dielectric material at least partially surrounding the at least one second inductor.

10. The testing probe system of claim 1, wherein the carrier comprises a cavity carrier comprising cavities configured to receive at least portions of pillars of the 3D Interconnect structures.

11. The testing probe system of claim 1, wherein the carrier comprises a wafer chuck.

12. A method of testing at least one die, the method comprising:
positioning a first probe interface having at least one first inductor on a first side of the at least one die having at least one 3D Interconnect structure;
positioning a second probe interface having at least one second inductor on a second side of the at least one die opposing the at least one first inductor;
generating an electromagnetic field within the at least one first inductor of the first probe interface;
initiating an energy within the at least one 3D Interconnect structure responsive to the at least one electromagnetic field; and
sensing an energy within the at least one 3D Interconnect structure with the at least one second inductor of the second probe interface.

13. The method of claim 12, based at least partially on the sensed energy, determining whether the at least one 3D Interconnect structure includes one or more defects.

14. The method of claim 13, further comprising:
upon determining whether the at least one 3D Interconnect structure includes one or more defects, picking up the at least one die with a pick and place tool; and
placing the at least one die on one or more of a tape, a wafer, a higher level packaging, or a stacking die.

15. The method of claim 13, further comprising, upon determining whether the at least one 3D Interconnect structure includes one or more defects, positioning the at least one first inductor of the first probe interface proximate to another at least one 3D Interconnect structure.

16. The method of claim 12, wherein positioning the first probe interface having the at least one first inductor comprises positioning a first array of inductors.

17. The method of claim 16, wherein generating an electromagnetic field within the at least one first inductor of the first probe interface comprises sequentially generating an electromagnetic field within each inductor of the first array of inductors.

18. The method of claim 12, wherein positioning the second probe interface having the at least one second inductor comprises positioning a second array of inductors.

19. The method of claim 12, wherein positioning the second probe interface having the at least one second inductor comprises positioning the second side of the at least one die on a carrier having a second array of inductors disposed therein.

20. A testing probe system comprising:
an energy source;
a first probe interface having a first inductor operably coupled to the first energy source and configured to be positioned on a first side of at least one die of a wafer comprising 3D interconnect structures;
an energy sensor; and
a second probe interface having a second inductor configured to be positioned on a side of the carrier opposing the first inductor,
wherein the energy source is configured to inductively generate energy within at least one 3D interconnect structure of the at least one die via the first inductor of the first probe interface, and wherein the energy sensor is configured to detect the energy within the at least one 3D interconnect structure via the second inductor of the second probe interface.

* * * * *

UNITED STATES PATENT AND TRADEMARK OFFICE
CERTIFICATE OF CORRECTION

| | |
|---|---|
| PATENT NO. | : 11,402,426 B2 |
| APPLICATION NO. | : 17/083193 |
| DATED | : August 2, 2022 |
| INVENTOR(S) | : Tony M. Lindenberg et al. |

Page 1 of 1

It is certified that error appears in the above-identified patent and that said Letters Patent is hereby corrected as shown below:

In the Specification

Column 1, Line 10, change "Dec. 1, 2020 the" to --Dec. 1, 2020, the--

Signed and Sealed this
Sixth Day of December, 2022

Katherine Kelly Vidal
*Director of the United States Patent and Trademark Office*